(12) United States Patent
Krause et al.

(10) Patent No.: US 6,971,039 B2
(45) Date of Patent: Nov. 29, 2005

(54) DDR TO SDR CONVERSION THAT DECODES READ AND WRITE ACCESSES AND FORWARDS DELAYED COMMANDS TO FIRST AND SECOND MEMORY MODULES

(75) Inventors: Gunnar Krause, Markt Schwaben (DE); Sebastian Kuhne, Radebeul (DE); Bernd Klehn, München (DE)

(73) Assignee: Infineon Technologies AG, Munich (DE)

( * ) Notice: Subject to any disclaimer, the term of this patent is extended or adjusted under 35 U.S.C. 154(b) by 674 days.

(21) Appl. No.: 10/075,539

(22) Filed: Feb. 14, 2002

(65) Prior Publication Data

US 2002/0134994 A1   Sep. 26, 2002

(30) Foreign Application Priority Data

Feb. 14, 2001   (DE) .............................. 101 06 817

(51) Int. Cl.[7] .............................................. G06F 5/00
(52) U.S. Cl. ...................... 713/400; 365/233; 711/167
(58) Field of Search ...................... 365/233; 713/400; 711/167

(56) References Cited

U.S. PATENT DOCUMENTS

| | | | |
|---|---|---|---|
| 5,971,923 A | | 10/1999 | Finger |
| 6,134,180 A | * | 10/2000 | Kim et al. .................. 365/233 |
| 6,446,158 B1 | * | 9/2002 | Karabatsos ..................... 711/5 |
| 6,507,888 B2 | * | 1/2003 | Wu et al. .................. 711/105 |

OTHER PUBLICATIONS

Ikeda, H.: "High-Speed DRAM Architecture Development", IEEE, vol. 34, No. 5, May 1999, pp. 685-692.
"DDR SDRAM Functionality and Controller Read Data Capture", Micron Technology Inc., vol. 8, Issue 3, pp. 1-24.

* cited by examiner

*Primary Examiner*—Thomas Lee
*Assistant Examiner*—Albert Wang
(74) *Attorney, Agent, or Firm*—Laurence A. Greenberg; Werner H. Stemer; Ralph E. Locher

(57) ABSTRACT

A memory module is described which, externally, has the functionality of DDR SDRAMs and contains two groups of conventional SDRAMs. A conversion device provides for the conversion of clock signals, commands, and data. The conversion device contains a changeover switch, a delay locked loop and buffer memory for addresses and commands and also for the data, which are driven in a suitable manner by the delay locked loop.

8 Claims, 3 Drawing Sheets

DDR TO SDR CONVERSION THAT DECODES READ AND WRITE ACCESSES AND FORWARDS DELAYED COMMANDS TO FIRST AND SECOND MEMORY MODULES

BACKGROUND OF THE INVENTION

FIELD OF THE INVENTION

The invention relates to a memory configuration having at least two semiconductor memory modules in which data are output and input in a manner dependent on a clock signal.

In semiconductor memories that are operated synchronously, data and commands are input and output clock-synchronously with an operating clock signal that is present externally. On the one hand, semiconductor memories are known in which commands and data are present in a valid manner synchronously with the rising edge of the clock signal. This type of synchronous semiconductor memory is referred to as synchronous dynamic random access memory (SDRAM). On the other hand, semiconductor memories that work synchronously are known in which the data are present in a valid manner synchronously with the rising and falling clock edges. During reading, the data values are valid in a manner shifted by a quarter of a clock cycle synchronously with an edge of the clock signal and during writing they are valid synchronously with the edges of the clock signal. This type of semiconductor memory is referred to as double data rate synchronous dynamic random access memory (DDR SDRAM). On account of the less stringent requirements imposed on the tolerance of the circuits, SDRAMs are less expensive to fabricate than DDR SDRAMS. The conception of DDR SDRAMs is more recent, so that their production and availability are just starting, whereas there is a plentiful supply of SDRAMs available in the market. Therefore, there is an endeavor to be able to operate system architectures with SDRAMs that have DDR SDRAM functionality, in order to be able to exploit the higher data rate in DDR SDRAMS.

U.S. Pat. No. 5,971,923 describes a configuration for processing acoustic data that has a processor architecture with a memory. The memory is connected to the further components of the processor architecture via an interface device. The interface device serves for converting control signals and for the temporary buffering of data and otherwise controls the memory in other ways. The memory can be constructed from different types of memory modules that are operated synchronously or non-synchronously. Inter alia, SDRAMs can be used.

SUMMARY OF THE INVENTION

It is accordingly an object of the invention to provide a memory configuration that overcomes the above-mentioned disadvantages of the prior art devices of this general type, which contains SDRAMs and, externally, has DDR SDRAM functionality.

With the foregoing and other objects in view there is provided, in accordance with the invention, a memory configuration. The memory configuration contains at least two semiconductor memory modules, including a first semiconductor memory module and a second semiconductor memory module, controlled by internal clock signals. The two semiconductor memory modules output or receive data only on one of a rising edge and a falling edge. An interface device is provided for receiving an external clock signal and the data on a rising edge and a directly succeeding falling edge of the external clock signal or outputs the data between the rising edge and the directly succeeding falling edge of the external clock signal. A conversion device is connected between the interface device and the two semiconductor memory modules to route the data for outputting or reception.

The memory configuration according to the invention has two blocks of SDRAMs which process in a valid manner, that is to say input or output, which is also referred to as writing or reading, data only for one edge type, that is to say respectively only ever a negative or only ever a positive edge of the clock signal. Externally, an interface device ensures that the memory configuration is seen as a DDR SDRAM with corresponding functionality. A conversion device causes the external commands, data and other signals that are to be input or output to be adapted inwardly to the requirements of the SDRAMs. The semiconductor memory modules and also the interface device and the conversion device are disposed on a single circuit board, a so-called memory module. Depending on the number of data bits to be processed in parallel, the so-called data word width, a multiplicity of SDRAMs can be connected in parallel with the at least two SDRAMs. In a general form, the module thus contains two groups of SDRAMs respectively addressed in parallel. This produces a memory module that, in its internal construction, has conventional SDRAMs that can be fabricated relatively inexpensively, but outwardly has DDR SDRAM properties. The module can be produced more simply, more flexibly and more quickly than a monolithically integrated DDR SDRAM.

The clock signals that can be fed to the two groups of SDRAMs are shifted by 180 degrees, that is to say by half a clock cycle. The conversion device generates the complementary clock signals with a delay locked loop to which, on the input side, the external clock signal supplied by the interface device is fed and which, on the output side, forwards the two complementary clock signals to the corresponding clock signal inputs of the two groups of SDRAMs.

The read operation and the write operation are produced by negative pulses of two control signals, namely the control signal for row access (Row Address Strobe (RAS)) and the control signal for column access (Column Address Strobe (CAS)). As is known, the memory cells are disposed in rows and columns and can be selected by a column address and a row address determined from the address of the memory cell. The valid presence of the respective row or column address is specified by the signals RAS, CAS.

During the reception of data or writing, in SDRAMs the signals RAS and CAS are present in each case on the negative edge in a manner separated from one another by two clock periods. In the DDR SDRAM, the signals RAS and CAS are present on the rising edge in a manner separated from one another by two clock periods. In SDRAMs, the corresponding data value for inputting to the memory module is also present, in an edge centered manner, at the same time as the signal CAS that is valid on the falling edge. In DDR SDRAMs, during writing, the data are seen as valid in an edge-centered manner, the data being received two clock periods after the presence of the signal CAS on a rising edge of the clock signal. The corresponding conversion of commands and data of the DDR SDRAM protocol, according to which data and commands are applied externally to the interface, to the SDRAM protocol, which proceeds directly on the semiconductor modules on the module, is effected by the conversion device. Thus, the pulses of the signals RAS and CAS that are applied to the interface are delayed by 3½ clock periods with regard to the externally applied clock signal and then applied to the first group of SDRAMs. The signals RAS and CAS are delayed by three clock periods and applied to the second group of SDRAMs. The data input externally are delayed by exactly one clock cycle with regard to the external clock signal for application to the first group of SDRAMs and likewise by exactly one clock cycle for application to the second group of SDRAMs.

During the reading or outputting of data, in an SDRAM the data edges are present on the output side in a manner centered with respect to the clock signal two clock cycles after the pulse of the signal CAS. In a DDR SDRAM, the data are present 2¼ clock cycles after a pulse of the signal CAS, that is to say in a centered manner relative to the center of a half-cycle of the clock signal for the DDR SDRAM. Therefore, in the event of a read access to the DDR SDRAM interface, the signals RAS and CAS are to be applied directly to the first group of SDRAMs and are to be applied to the second group in a manner delayed by half an operating clock cycle of the clock signal for the DDR SDRAM. For the read-out from the first group of SDRAMs to the DDR SDRAM interface, the data are delayed by the conversion device by a quarter of a clock period of the external clock signal, and likewise by a quarter of a clock period in the case of the read-out from the second group of SDRAMs.

The corresponding conversion of command signals and data signals is effected by the conversion device as specified above. The conversion device contains a changeover switch via which data can be input and output in the corresponding word width. The changeover switch has the function of a multiplexer or demultiplexer. The common terminal of the changeover switch is connected to the interface device, and the alternately drivable outputs of the changeover switch are connected to the respective data terminals of the different groups of SDRAMs. The changeover is effected in a manner dependent on the delay locked loop for each level change of the clock signal fed in externally, that is to say with twice the frequency of the clock signal fed in externally. During reading and writing, the data are combined from the two groups of SDRAMs or shared between the two groups in such a way that, seen from the external interface, data of the first group and of the second group alternate with one another.

The DDR SDRAM access protocol provides for the read-in and output data to be validated synchronously with a sampling clock. The clock signal to be generated is referred to as a so-called data strobe signal DQS. The conversion device has such a DQS signal generator. During reading, data and the signal DQS are generated in such a way that an edge of the data signal which represents the data value to be output is oriented to an edge of the signal DQS, and that, during the writing of a data value, one of the logic signal levels of the data signal representing the data value is oriented to an edge of the signal DQS. The meaning of the signal DQS is known in the prior art and described for example in the literature reference Design Line from Micron Technology Incorporated, Volume 8, issue 3, 3rd quarter 1999, entitled "IDDR SDRAM Functionality and Controller Read Data Capture".

In accordance with an added feature of the invention, the conversion device has a delay locked loop with an input side receiving the external clock signal and an output side outputting the complementary clock signals functioning as the internal clock signals. The delay locked loop is connected to the interface device.

In accordance with an additional feature of the invention, the conversion device has a command decoder for detecting a command for receiving data. The command for receiving data contains at least two signal pulses present on the rising edge of the external clock signal. The command for receiving data is forwarded to the first semiconductor memory module in a manner delayed by 3½ clock periods of the external clock signal and is forwarded to the second semiconductor memory module in a manner delayed by three clock periods of the external clock signal.

In accordance with another feature of the invention, the command decoder detects a command for outputting data. The command for outputting data contains two signal pulses present on the rising edge of the external clock signal. The command for outputting data is forwarded to the first semiconductor memory module in a manner delayed at most by one clock cycle of the external clock signal and is forwarded to the second semiconductor memory module in a manner delayed at most by 1½ clock periods of the external clock signal.

In accordance with a further feature of the invention, the command for receiving data contains the two signal pulses that each have a low level and are centered with respect to two rising edges of the external clock signal that are separated by two clock periods.

In accordance with another added feature of the invention, the interface device has a data signal terminal. A first data value to be output or input at the first semiconductor memory module and a second data value to be output or input at the second semiconductor memory module are alternately present at the data signal terminal of the interface device after every half clock period of the external clock signal.

In accordance with another additional feature of the invention, the conversion device contains a signal generator for generating a clock signal whose edges are oriented to edges of a data signal during a data outputting and which has edges which are oriented to a binary signal level of the data signal during a data inputting.

In accordance with another further feature of the invention, the conversion device has at least two further memory modules for storing a respective further bit of a data word. One of the further memory modules is connected in parallel with the first semiconductor memory module and another of the further memory modules is connected in parallel with the second semiconductor memory module.

In accordance with a concomitant feature of the invention, the command for outputting data contains the two signal pulses that each have a low level and are centered with respect to two rising edges of the external clock signal which are separated by two clock periods.

Other features which are considered as characteristic for the invention are set forth in the appended claims.

Although the invention is illustrated and described herein as embodied in a memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
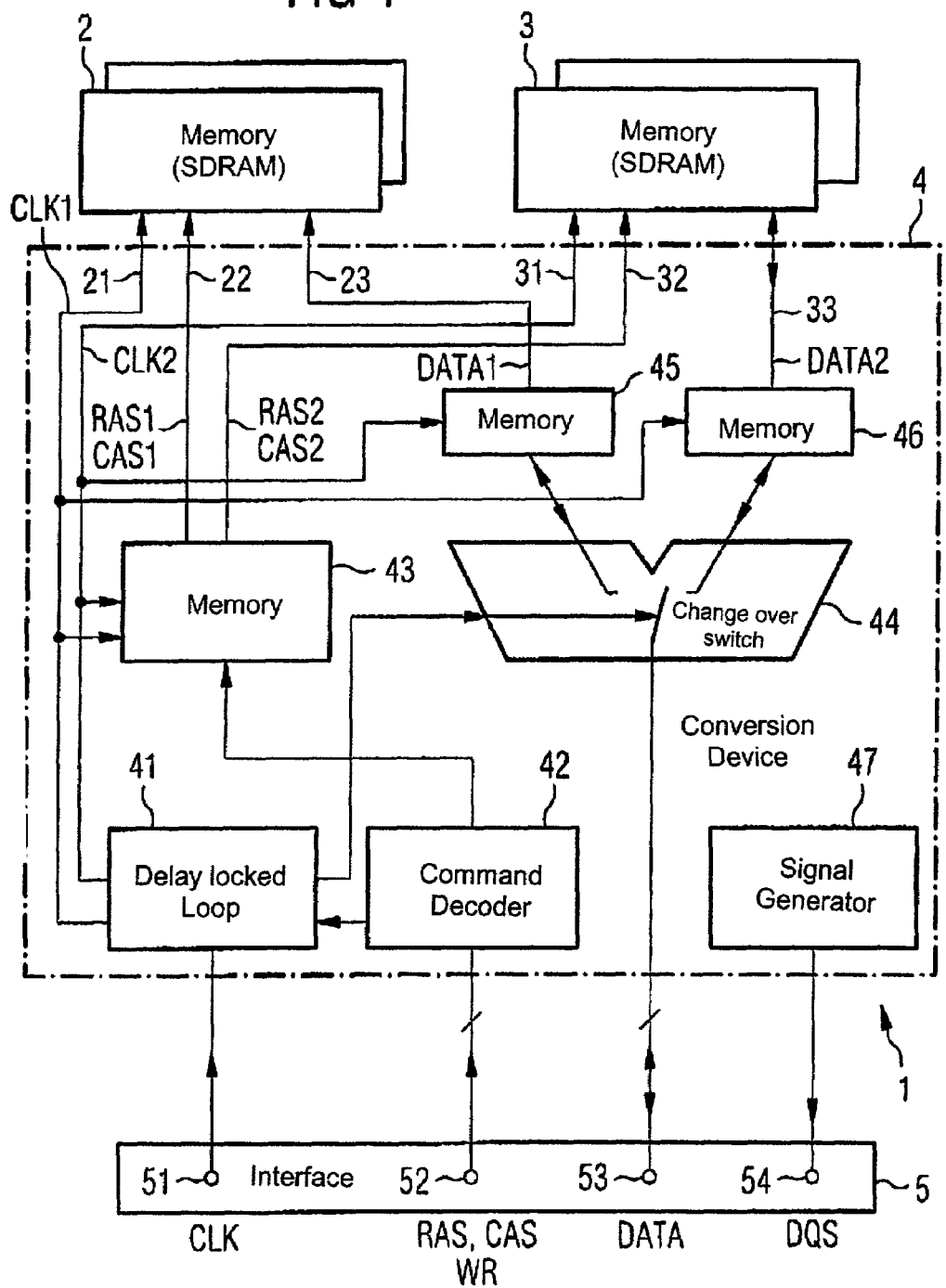
FIG. 1 is a block diagram of a memory module containing the memory configuration according to the invention.

Referring now to the figures of the drawing in detail and first, particularly, to FIG. 1 thereof, there is shown a memory module 1 that contains two groups of SDRAMs 2 and 3, a conversion device 4 and also an interface 5. The interface 5 has a terminal 51 for a clock signal CLK, terminals 52 for commands, terminals 53 for data inputting and data outputting and terminals 54 for a data strobe signal DQS. The clock signal CLK is a clock signal that controls the synchronous memory operation. For command inputting, different combinations of signal states of the row address strobe signal RAS, of the column address strobe signal CAS and of a write/read signal WR are evaluated. One or more terminals are available for data DATA in accordance with a word width. The signal DQS at the terminal 54 serves for validating the data to be written or to be read which are present at the terminal 53. By way of example, the module 1 is inserted into a slot of a computer whose bus operates according to the DDR SDRAM protocol. The bus and all the terminals 51, 52, 53, 54 are driven by a memory controller. The command, clock and data signals which are present with DDR SDRAM functionality on the bus side at the interface 5 of the module 1 are converted by the conversion device 4 in such a way that conventional SDRAMs 2 and 3 can be addressed.

In accordance with the word width of the data DATA fed in at the terminal 53, a number of SDRAM memory modules identical to the number of terminals 53 are provided in each case in the groups 2 and 3. All the SDRAMs of the groups 2 and 3 are addressed in parallel. The groups 2 and 3 of the SDRAMs are addressed at their respective terminals 21 and 31, 22 and 32, and 23 and 33, with clock signals CLK1, CLK2, commands RAS1, CAS1, RAS2, CAS2 and data DATA1, DATA2.

The conversion device 4 that converts between DDR SDRAM functionality and pure SDRAM functionality has a delay locked loop 41, to which, on an input side, the clock signal CLK is fed and which, on an output side, generates the clock signals CLK1, CLK2, which are complementary with respect to one another. The conversion device 4 furthermore has a command decoder 42, which is connected to the terminals 52 and converts corresponding commands for reading, writing, refresh, standby state, etc. in a manner dependent on the signals fed to it. The command signals for writing and reading are of particular interest in the present case. A buffer memory 43 serves for buffer-storing the commands detected by the command decoder 42 and delays the signals for RAS and CAS, as explained below in connection with FIGS. 2 and 3, for forwarding to the SDRAM groups 2 and 3. Furthermore, comparable to the buffer memory 43, an address buffer is provided in order to convert and forward in a correctly timed manner the addresses—applied via the interface device 5—for the memory cells to the SDRAM groups 2 and 3. What is essential is a multiplexer and demultiplexer 44, which connects the data terminals 53 of the interface 5 to the data terminals 23 and 33 of the SDRAM groups 2 and 3. The changeover switch 44 operates bi-birectionally. It changes over between the SDRAM groups 2 and 3 in each case alternately during write and read operations, in order to generate or tap off at the output 53 a sequence of data values which can be assigned alternately to the SDRAM groups 2 and 3. The changeover switch 44 is to be switched either into one position or into the other position for every half clock cycle of the external clock signal CLK, so that the terminals 53 are alternately connected to the terminals 23 and 33 in accordance with the double DDR SDRAM data rate. The data values are to be delayed, in a manner that will be specified in more detail in connection with FIGS. 2 and 3, during reading and writing by different proportions of a clock period of the external clock signal CLK. Therefore, respective data buffer memories 45 and 46 for buffer-storing a data word are connected into the signal paths between the changeover switch 44 and the SDRAM groups 2 and 3. The buffer memories 45, 46 are controlled cyclically by clock signals correspondingly provided by the delay locked loop 41.

Figure 2:
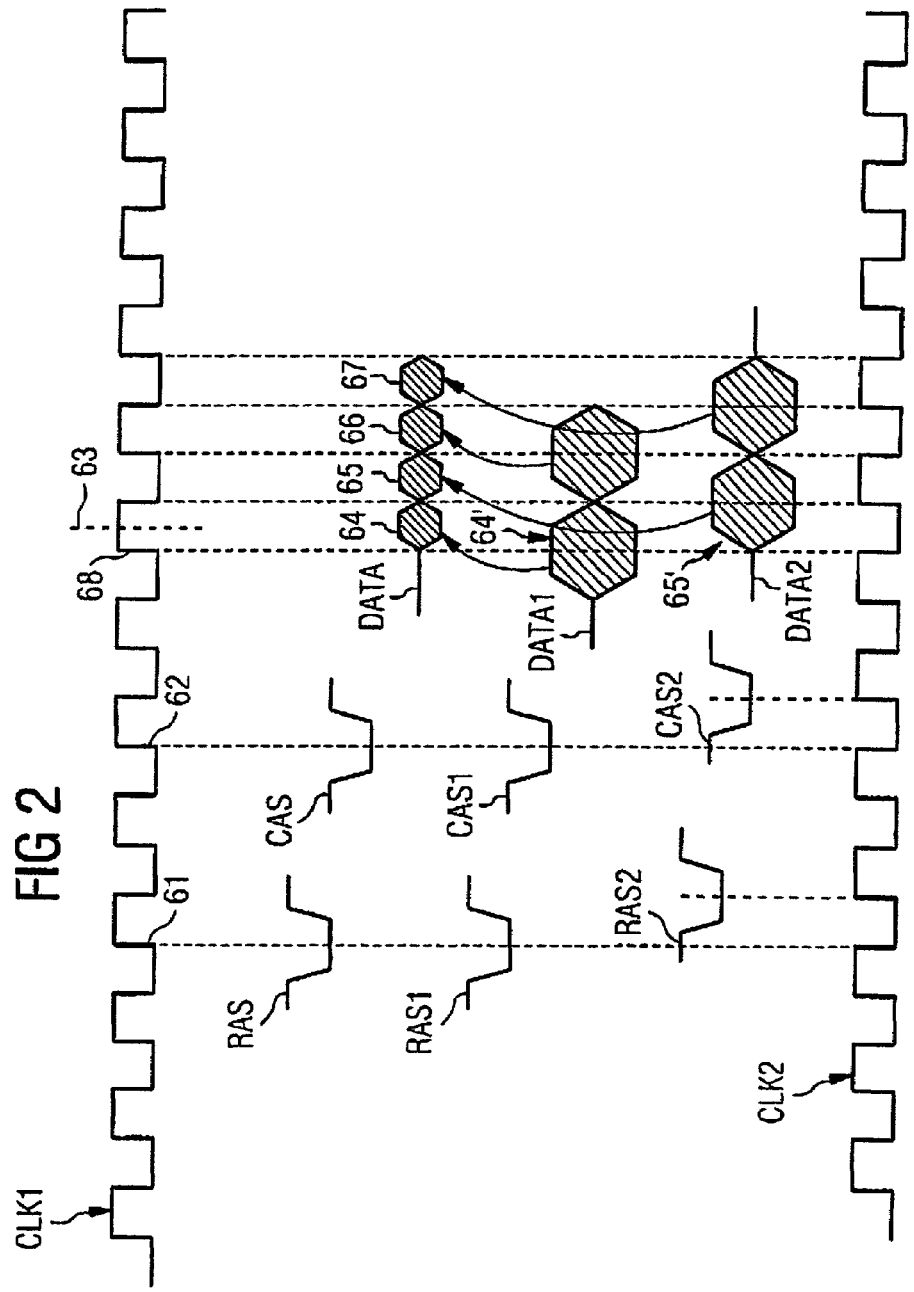
FIG. 2 is a diagram showing signal profiles during a read access.

The time sequence of data, command and clock signals during a read access is illustrated in FIG. 2. A read access is communicated to the module 1 externally by negative pulses of the signals RAS, CAS on rising edges 61, 62 of the clock signal CLK which are separated from one another by two clock periods. The clock signal CLK is also applied simultaneously to the SDRAM group 2. The data values DATA are then tapped off at the output terminal 53 in a manner delayed by 2½ clock periods. The data values DATA each have a bit 64, 65, 66, 67 which is provided alternately by a signal DATA1 of the SDRAM group 2 or by a signal DATA2 of the SDRAM group 3. The data bit 64 and also the further data bits during a read operation in a DDR SDRAM are present in a valid manner synchronously with the center of a clock pulse, e.g. 63, of the external clock signal CLK.

The read command applied externally to the module is forwarded to the SDRAMs 2 without any delay. Therefore, the signals RAS, CAS at the terminals 52 are forwarded as signals RAS1, CAS1 to the SDRAMs 2. This is done without any delay in FIG. 2. For the technical realization, if appropriate, on account of the signal and processing times within the conversion device 4, in particular in order to comply with setup and hold times, it is necessary to include a delay by one clock period of the signal CLK. Such a delay is not illustrated in FIG. 2, for simplification. Once the signals RAS1 and CAS1, pulse-synchronously, the associated row and column addresses have been applied to the SDRAMs 2, a data value 641 of the data signal DATA1 is available at the SDRAMs 2 after the pulse CAS1 in a manner delayed by two clock periods, synchronously with the edge 68. Since, in accordance with the SDRAM specification, during reading, a data value is present synchronously with the rising edge, e.g. 68, but for DDR SDRAMs a data value is present synchronously with the center of a clock pulse, e.g. 63, the data value 64' output at the SDRAMs 2 is to be delayed with regard to the clock signal CLK or CLK1 by a quarter of a clock period of the clock signals.

The commands RAS2, CAS2 and the corresponding row and column addresses are to be fed to the SDRAMs 3 synchronously with the rising edge of the clock signal CLK2 in a manner separated from one another by two clock periods in each case. Proceeding from the commands RAS, CAS applied externally to the terminal 52, the pulses RAS2, CAS2 are delayed by half of a clock period with regard to the external clock signal CLK. In order to take account of setup and hold times, as already explained above, it is necessary to insert a delay by a further complete clock period. Relative to the clock signal CLK2, a data value 65' read out from the SDRAMs 3 is present on the rising edge two clock periods later. It is to be delayed by a quarter of a clock period in order to be able to be output as data value 65 in the data signal DATA at the terminal 53 of the module 1.

The delay of the data values 64' and 65' by half of a clock period is affected by corresponding addressing of the buffer memories 45, 46. The connection to the output terminal 53 is effected by a changeover of the changeover switch 44 for every half-clock period of the signal CLK.

Figure 3:
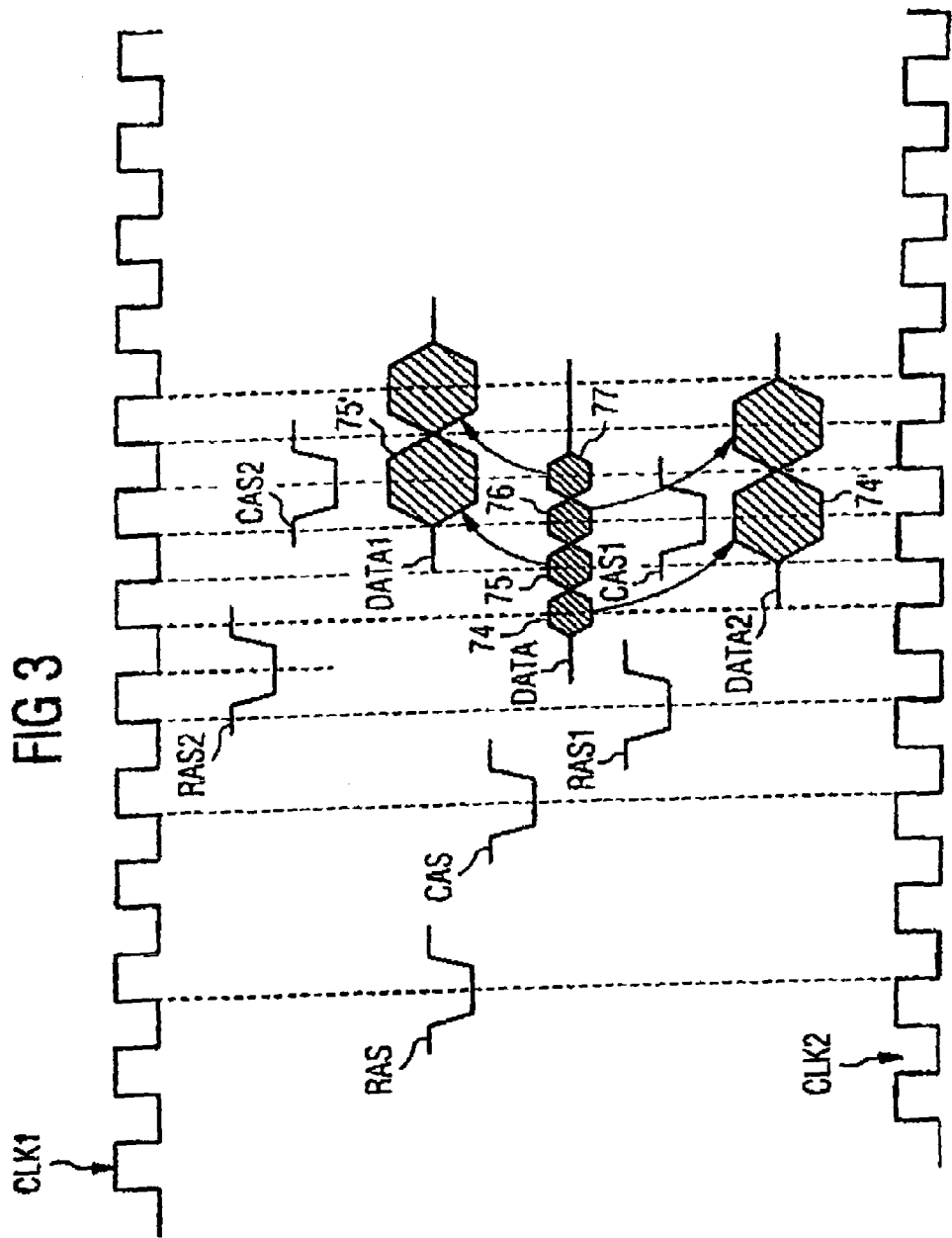
FIG. 3 is a diagram showing signal profiles during a write access.

The write operation in FIG. 3 shows the signals RAS, CAS on a respective rising edge of the signal CLK. Row and column addresses are applied at the same time as the negative pulses of the signals RAS, CAS. The distinction between reading and writing is controlled by the signal WR fed in at the terminal 52. Data bits 74, 75, 76, 77 for the data signal DATA are present at the data terminals 53 of the module 1 with the rising edge in a delayed manner two clock periods after the application of the signal CAS. The write command and the corresponding column and row addresses are communicated to the SDRAMs 2 in a manner delayed by three full clock periods of the external clock signal CLK. In accordance with the SDRAM functionality, the data are to be provided synchronously with the row address pulse CAS1. The data bits 74 are therefore to be delayed by one clock period of the clock signal CLK and are to be fed as data bits 74' synchronously with the pulse CAS1 to the SDRAMs 2. The delay is affected by the buffer memory 45 and the suitable clock driving derived from the delay locked loop 41.

Row and column addresses are fed to the SDRAMs 3 synchronously with the row and column address pulses RAS2, CAS2 which are generated from the externally applied row and column pulses RAS, CAS and row and column addresses through a delay by 3½ clock cycles of the external clock signal CLK. The data value 75' is thereupon present at the data terminals 33 of the SDRAMs 3 synchronously with the column address pulse CAS2. The data bits 75' are obtained from the data bits 75 of the data signal DATA present at the terminal 53 through a delay by a full clock period. The delay is affected by the buffer memory 46 by suitable clock driving.

As illustrated above, the invention makes it possible for the module 1 to have, seen externally via the interface 5, the functionality of a DDR SDRAM, while conventional SDRAMs are used within the module 1, the conversion between DDR SDRAM and pure SDRAM functionality being affected by the conversion device 4.

The conversion device 4 furthermore has a conventional signal generator 47 for generating a clock signal DQS, which is used in DDR SDRAMs in order to specify the temporal validation of the data present in the data signal DATA. The meaning of the DQS signal and the relative phase angle thereof with respect to the data to be read or to be written is specified on page 5 of the above-mentioned literature reference in Micron Design Line. During reading, the edges of the signal DQS are oriented to the edges of the data DATA. During writing, the edges of the signal DQS are oriented to the center of a pulse of the data signal DATA.

We claim:

1. A memory configuration, comprising:
   at least two semiconductor memory modules, including a first semiconductor memory module and a second semiconductor memory module, controlled by internal clock signals, said two semiconductor memory modules output or receive data only on one of a rising edge and a falling edge;
   an interface device for receiving an external clock signal and the data on a rising edge and a directly succeeding falling edge of the external clock signal or outputying the data between the rising edge and the directly succeeding falling edge of the external clock signal; and
   a conversion device connected between said interface device and said two semiconductor memory modules to route the data for outputting or reception;
   the external clock signal being fed to said interface device, and said conversion device generating complementary clock signals, of which one of the complementary clock signals being fed to said first semiconductor memory module and another of the complementary clock signals being fed to said second semiconductor memory module;
   said conversion device having a command decoder for detecting a command for receiving data, the command for receiving data containing at least two signal pulses present on the rising edge of the external clock signal, and the command for receiving data being forwarded to said first semiconductor memory module in a manner delayed by 3½ clock periods of the external clock signal and being forwarded to said second semiconductor memory module in a manner delayed by three clock periods of the external clock signal;
   said command decoder detecting a command for outputting data, the command for outputting data containing two signal pulses present on the rising edge of the external clock signal, and the command for outputting data being forwarded to said first semiconductor memory module in a manner delayed at most by one clock cycle of the external clock signal and being forwarded to said second semiconductor memory module in a manner delayed at most by 1½ clock periods of the external clock signal.

2. The memory configuration according to claim 1, wherein said conversion device has a delay locked loop with an input side receiving the external clock signal and an output side outputting the complementary clock signals functioning as the internal clock signals, said delay locked loop connected to said interface device.

3. The memory configuration according to claim 1, wherein the command for receiving data contains the two signal pulses that each have a low level and are centered with respect to two rising edges of the external clock signal that are separated by two clock periods.

4. The memory configuration according to claim 1, wherein:
   said first semiconductor memory module has a data signal terminal;
   said second semiconductor memory module has a data signal terminal; and
   said conversion device has a changeover switch with a first terminal connected to said interface device, a second terminal connected to said data signal terminal of said first semiconductor memory module, and a third terminal connected to said data signal terminal of said second semiconductor memory module, said changeover switch able to switch over between said second terminal and said third terminal, and a driving of said changeover switch can be controlled in a manner dependent on each edge change of the external clock signal.

5. The memory configuration according to claim 4, wherein
   said interface device has a data signal terminal; and
   a first data value to be output or input at said first semiconductor memory module and a second data value to be output or input at said second semiconductor memory module are alternately present at said data signal terminal of said interface device after every half clock period of the external clock signal.

6. The memory configuration according to claim 1, wherein said conversion device contains a signal generator for generating a clock signal whose edges are oriented to edges of a data signal during a data outputting and which has edges which are oriented to a binary signal level of the data signal during a data inputting.

7. The memory configuration according to claim 1, wherein said conversion device has at least two further memory modules for storing a respective further bit of a data word, one of said further memory modules is connected in parallel with said first semiconductor memory module and another of said further memory modules is connected in parallel with said second semiconductor memory module.

8. The memory configuration according to claim 1, wherein the command for outputting data contains the two signal pulses that each have a low level and are centered with respect to two rising edges of the external clock signal which are separated by two clock periods.

* * * * *